(12) United States Patent
Lee et al.

(10) Patent No.: US 6,351,032 B1
(45) Date of Patent: Feb. 26, 2002

(54) METHOD AND STRUCTURE FOR HEATSPREADER ATTACHMENT IN HIGH THERMAL PERFORMANCE IC PACKAGES

(75) Inventors: Bernard K H Lee; Ben T C Tan; Emillo F. Mallare, Jr.; Sarvotham M. Bhandarkar; Subodh Mhaisalkar; Ai Min Tan, all of Singapore (SG)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/488,153

(22) Filed: Jan. 20, 2000

(51) Int. Cl.[7] .................. H01L 23/48; H01L 23/10
(52) U.S. Cl. ............... 257/706; 257/783; 257/787; 257/778
(58) Field of Search .................. 257/706, 783, 257/787, 778, 723, 724; 438/118, 112, 124, 127, 122, 128

(56) References Cited

U.S. PATENT DOCUMENTS

| | | | | |
|---|---|---|---|---|
| 4,092,697 A | * | 5/1978 | Spaight | 361/386 |
| 5,311,402 A | * | 5/1994 | Kobayashi et al. | 361/760 |
| 5,587,882 A | * | 12/1996 | Patel | 361/705 |
| 5,650,918 A | * | 7/1997 | Suzuki | 361/760 |
| 5,786,635 A | * | 7/1998 | Alcoe et al. | 257/718 |
| 5,977,642 A | * | 11/1999 | Appelt et al. | 257/780 |
| 6,091,603 A | * | 7/2000 | Daves et al. | 361/704 |
| 6,114,761 A | * | 9/2000 | Mertol et al. | 257/722 |
| 6,188,578 B1 | * | 2/2001 | Lin et al. | 361/717 |

* cited by examiner

Primary Examiner—Jhihan B Clark
(74) Attorney, Agent, or Firm—Beyer Weaver & Thomas, LLP

(57) ABSTRACT

Improved structures for and methods for assembling heatspreader attachments in integrated circuit packages permit attachment of a relatively low cost heatspreader having a high coefficient of thermal expansion directly to the back of a die while maximizing thermal performance, mechanical integrity and reliability of the assembly. The improvements are realized through the use of specific adhesive materials to attach the heatspreader to the die, heatspreader geometries, adhesive geometries, assembly techniques and underfill geometries.

29 Claims, 8 Drawing Sheets

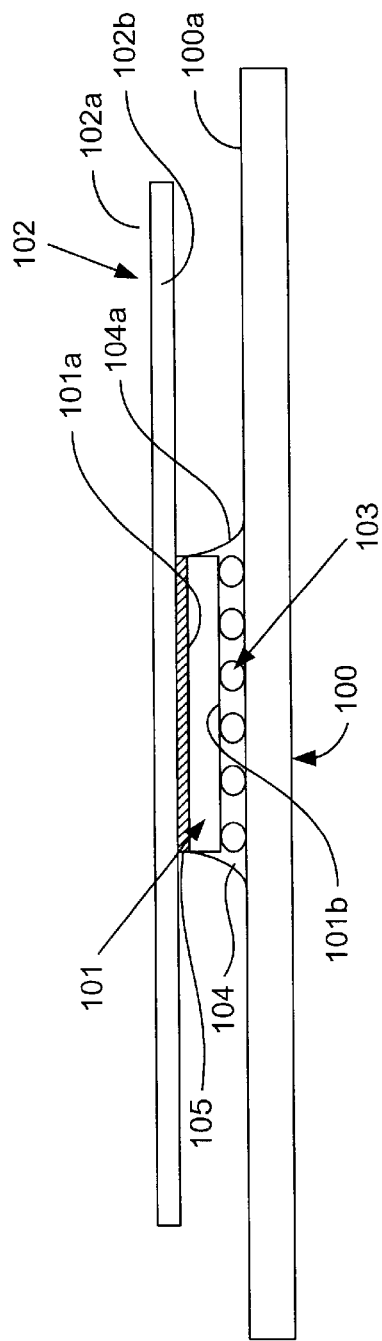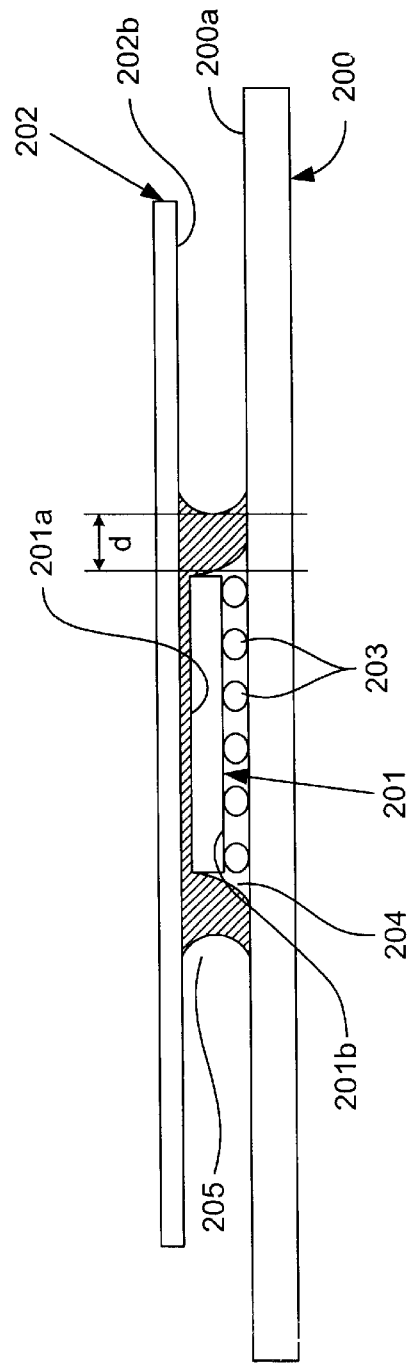
FIG. 1 (Prior Art)
FIG. 2

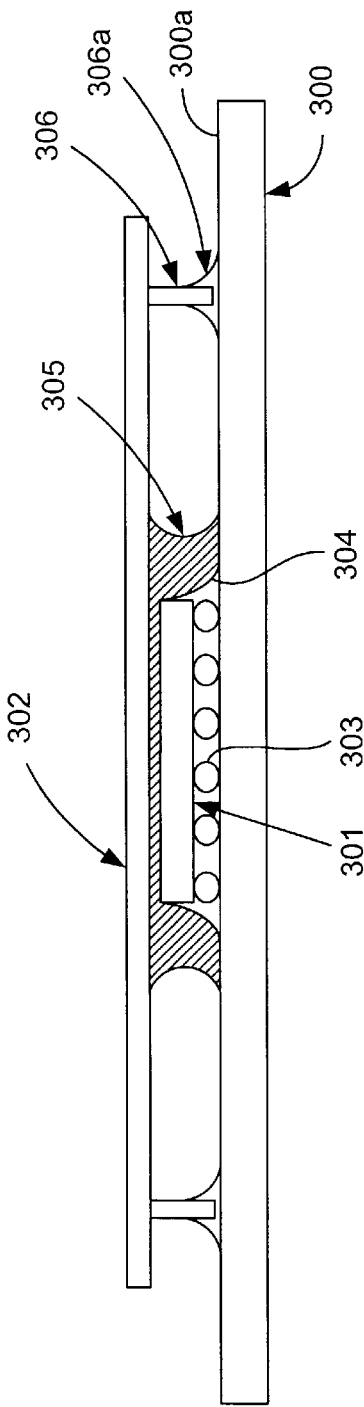
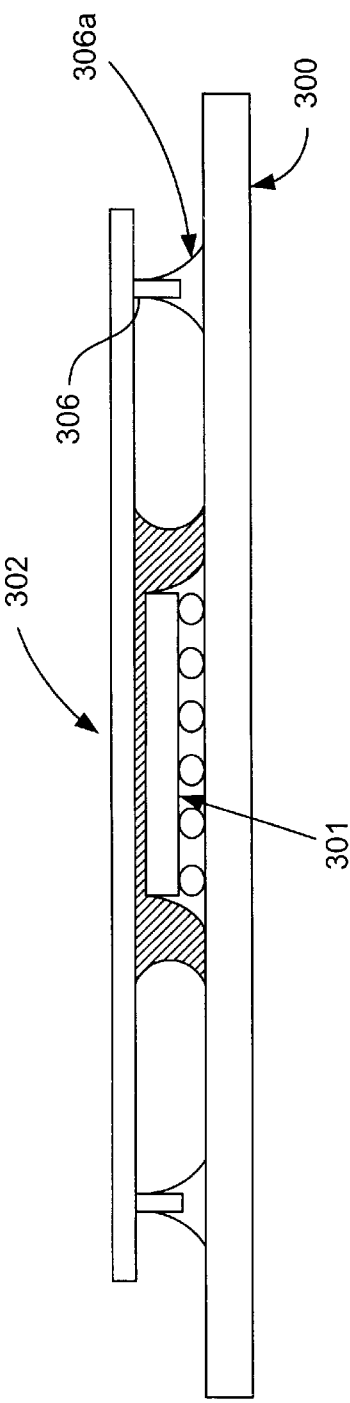
FIG. 3A
FIG. 3B

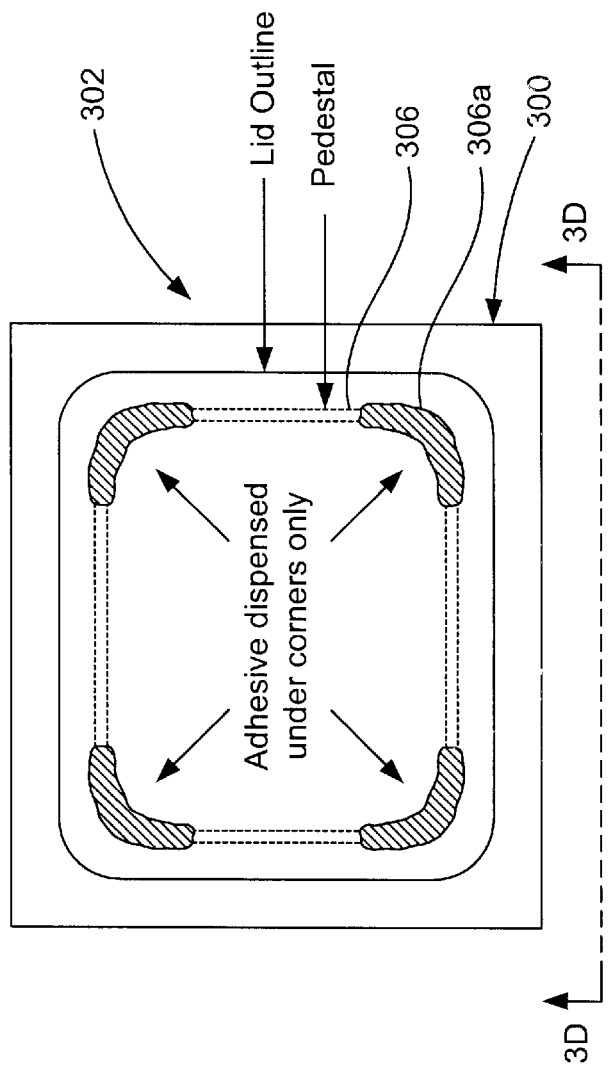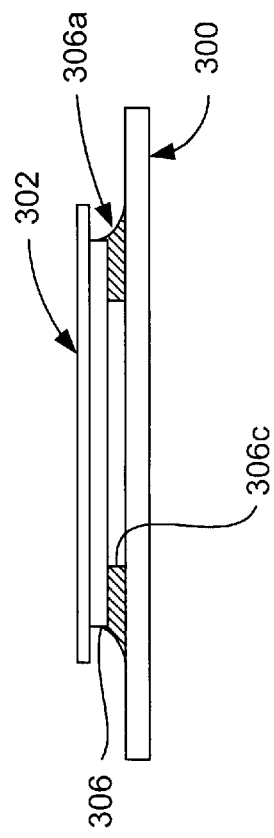
FIG. 3C
FIG. 3D

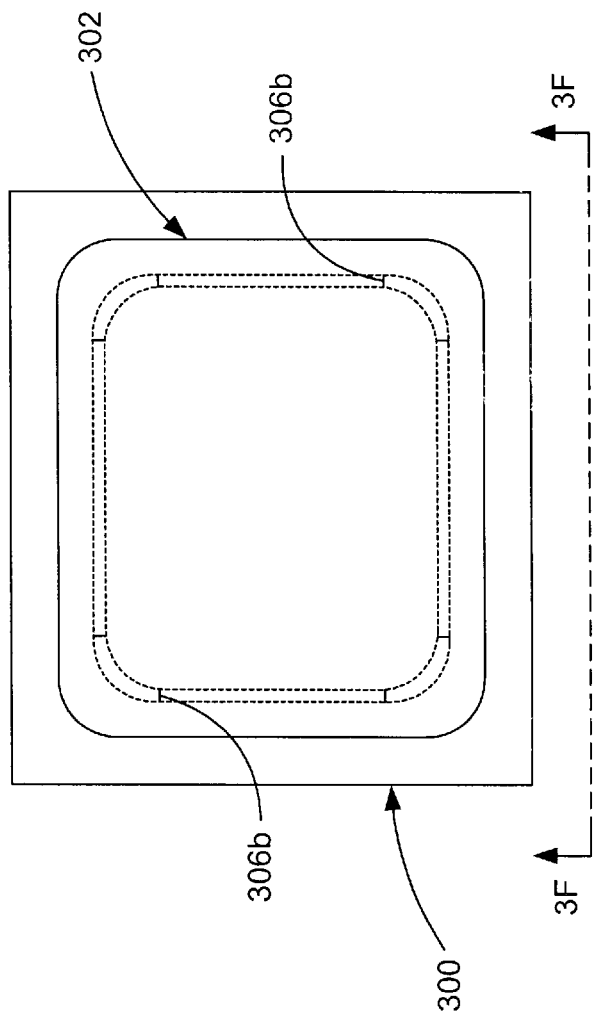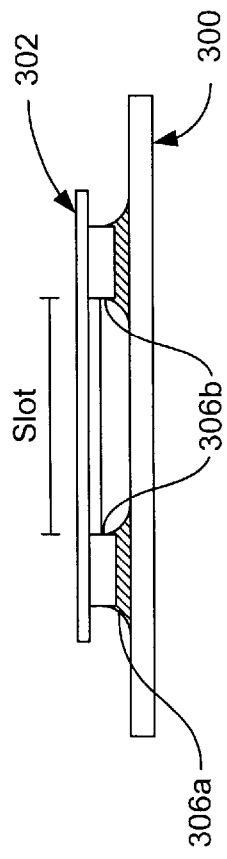
FIG. 3E
FIG. 3F

METHOD AND STRUCTURE FOR HEATSPREADER ATTACHMENT IN HIGH THERMAL PERFORMANCE IC PACKAGES

BACKGROUND OF THE INVENTION

1. Field of the Invention

The present invention relates to packaging assemblies for semiconductor integrated circuits. The present invention relates generally to electronic devices and assemblies. More particularly, the present invention relates to methods and structures for attaching a heatspreader in high thermal performance integrated circuit (IC) packages. Even more particularly, the present invention includes methods and structures for adhesively attaching high coefficient of thermal expansion (CTE) heatspreaders directly to the back of a die while maximizing thermal performance, mechanical integrity and reliability of the assembly.

2. Description of Related Art

Heat produced by integrated circuits through power dissipation must be conducted away from the integrated circuit. Otherwise, the circuit will be subjected to excessive thermal excursion and most likely will be damaged. One approach for conducting heat away from an integrated circuit is to attach the integrated circuit to a heatspreader which transmits the heat to a large surface cooled by air.

In the past, heatspreaders have been made of expensive materials and have had to be specially shaped and/or attached to the IC package using complicated and expensive assembly techniques. One example of such special shaping involves several specially shaped heatspreaders. These nonplanar configurations are expensive to manufacture and require precise mounting to operate correctly and to minimize damage to the semiconductor device to which they are attached. Moreover, the heatspreader is in essentially direct contact with the die, again complicating the fabrication of the device and increasing the cost of manufacture and the likelihood of damage to the semiconductor device.

Additionally, heatspreaders have been made of expensive alloys and other materials, typically having low CTEs (in the range of 2.0 to 6.5 ppm/C) to minimize thermomechanical stresses. The CTE mismatch between the heatspreader and the die is relatively small, not more than 4.0 ppm/C. As a result, the thermochemical stresses induced during typical reliability tests such as temperature cycling (TMCL) and autoclave/pressure chamber testing (ACLV/PCT) are relatively small and do not pose significant reliability problems. A major disadvantage of these materials is that special elements need to be alloyed into the heatspreaders in order to keep the CTE low, and this typically makes the heatspreaders quite expensive.

High CTE heatspreaders such as aluminum and copper are typically inexpensive compared to the low CTE materials mentioned above. These high CTE materials typically are more than 6 times less expensive than the low CTE materials. However, high CTE materials pose problems when they are attached directly to low CTE materials like the silicon die. The CTE mismatch between the heatspreader material and the silicon die causes delamination at the interfaces of the attachment material due to the thermomechanical stresses, thus adversely affecting the overall thermal performance as well as the mechanical integrity of the package. The invention disclosed and claimed herein includes techniques to overcome these drawbacks and successfully achieve a mechanically durable and reliable assembly with excellent thermal performance for high CTE heatspreaders. This enables the user to successfully take advantage of the low cost offered by high CTE heatspreaders.

SUMMARY OF THE INVENTION

The present invention includes methods and structures for adhesively attaching high coefficient of thermal expansion (CTE) heatspreaders directly to the back of a die while maximizing thermal performance, mechanical integrity and reliability of the assembly, thereby overcoming the shortcomings of earlier methods and structures.

The present invention uses improved structures and methods for assembling heatspreader attachments in integrated circuit packages, permitting attachment of a relatively low cost heatspreader having a high coefficient of thermal expansion directly to the back of a die while maximizing thermal performance, mechanical integrity and reliability of the assembly. The improvements are realized through the use of heatspreader geometries, adhesive geometries, assembly techniques and underfill geometries and specific adhesive materials to attach the heatspreader to the die.

DETAILED DESCRIPTION OF THE DRAWINGS

FIG. 1 is a side view of a prior art geometry for the attachment of a flat heatspreader to a die secured to a substrate using underfill material and adhesive.

FIG. 2 is a side view of a geometry of the present invention for the attachment of a flat heatspreader to a die secured to a substrate using underfill material and adhesive.

FIG. 3A is a side view of a pedestal supported heatspreader attachment assembly according to one embodiment of the present invention.

FIG. 3B is a side view of a floating pedestal supported heatspreader attachment assembly according to one embodiment of the present invention.

FIG. 3C is a top view of a floating pedestal supported heatspreader attachment assembly according to one embodiment of the present invention in which adhesive is applied in an intermittent distribution.

FIG. 3D is a side view of the floating pedestal supported heatspreader attachment assembly taken along the line 3D—3D of FIG. 3C.

FIG. 3E is a top view of a pedestal supported heatspreader attachment assembly according to one embodiment of the present invention in which slots are provided in the pedestal.

FIG. 3F is a side view of the pedestal supported heatspreader attachment assembly taken along the line 3F—3F of FIG. 3E.

In the FIGURES, like reference numerals refer to like components.

DESCRIPTION OF THE PREFERRED EMBODIMENT

Figure 4:
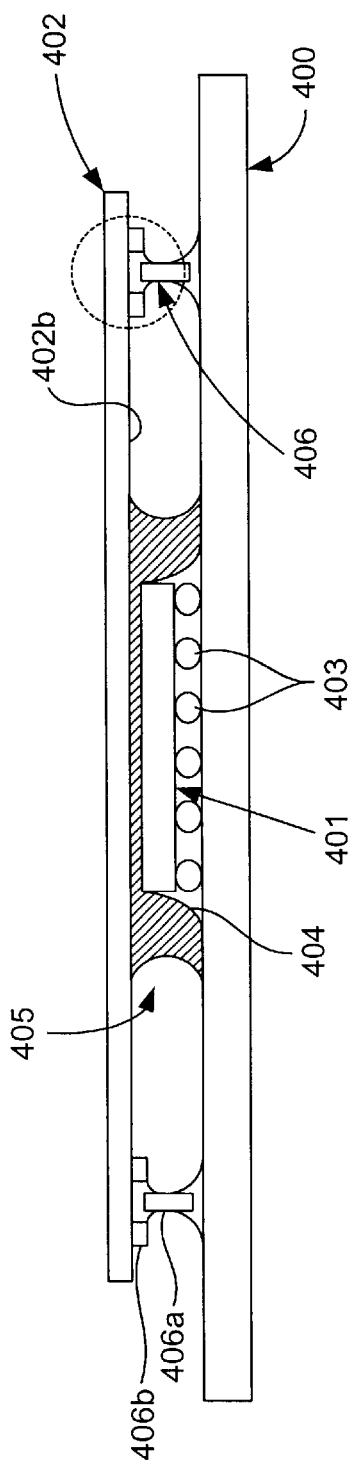
FIG. 4 is a side view of a two part heatspreader attachment of a flat heatspreader to a die secured to a substrate using underfill material and adhesive.

The present invention includes methods and structures for adhesively attaching high coefficient of thermal expansion (CTE) heatspreaders directly to the back of a die while maximizing thermal performance, mechanical integrity and reliability of the assembly. The present invention may be used and its advantages enjoyed using a variety of components and methods. For purposes of illustration, however, the present invention is shown with particular exemplar components.

Although the preferred embodiment(s) of the present invention are shown and described in detail, it should be understood that the present invention may be embodied in many other specific structures and methods without departing from the spirit or scope of the invention. Therefore, the following examples are to be considered as illustrative and not restrictive, and the invention is not to be limited to the details given herein, but may be modified within the scope of the claims which follow.

General Configuration

The preferred embodiment of each version of the present invention is shown in the FIGURES. Generally, as seen in FIG. 1, a prior art heatspreader assembly includes a generally planar substrate 100 having a top surface 100a, a die 101 having a generally planar top surface 101a and a bottom surface 101b, and a generally planar heatspreader 102 having a bottom surface 102b.

The die 101 illustrated as an example in FIG. 1 is a die used in this description strictly for purposes of illustration and by way of example only. Die 101 may be made of any material known to those of ordinary skill in the art. The substrate 100 can be made of any suitable known substrate material for example Alumina ceramic or bismaleimidetriazine(BT).

As illustrated for example in FIG. 1, there are a number of interconnects 103 attached to the bottom surface 101b of die 101. Interconnects 103 permit electrical connection of the die 101 to the substrate 100 and may be one or more of the types well known to those of ordinary skill in the art. Die 101 is attached to substrate 100 by the interconnects 103, and is optionally underfilled by underfill material 104 The underfill 104 serves to enhance the attachment of the die 101 to substrate 100 and, to a limited degree, protects the interconnects 103 and die 101 from damage, corrosion and other environmental dangers. Underfill material 104 is applied in a manner designed to adequately secure the die 101 and the interconnects 103, and has a fillet edge 104a adjacent to the periphery of die 101. The fillet edge 104a is a tapered band of underfill material that provides a gradual transition from the vertical edge of the die 101 to the horizontal upper surface 100a of the substrate 100.

The heatspreader 102 is attached to the upper surface 101a of the die 101 using an adhesive bondline 105. An adhesive of the present invention will be described in more detail below which provides improved performance over the adhesives of the prior art. The adhesive in FIG. 1 forms a bondline 105 between the lower surface 102b of heatspreader 102 and the upper surface 101a of the die 101. The thickness of the bondline 105 directly affects the performance of the heatspreader as will be discussed below.

In the typical assembly process, the die 101 is first attached to the substrate 100 on the lower surface 101b of the die 101. Adhesive is then applied to the upper surface 101a of the die 101. The heatspreader is placed on the adhesive and then pressed down onto the adhesive and die 101. The adhesive usually is not cured at this time. The heatspreader 102 is held in a preselected position relative to the die 101 by appropriate fixtures that apply pressure in a normal or orthogonal direction (along the "Z-axis") to the surfaces of the die 101 and the heatspreader 102. Moreover, these fixtures prevent any lateral displacement (X-Y axes displacement) of the heatspreader 102 relative to the die 101. The adhesive is then cured after which the fixtures may be removed.

Heatspreader, Adhesive and Underfill Geometries

As described in more detail below, utilizing specific heatspreader geometries, adhesive geometries and underfill geometries can enhance the performance of the die/heatspreader assembly. Such augmentation of the die/heatspreader assembly will improve the thermal performance of the assembly, provide a more robust assembly and protect the die from damage due to environmental and other potential hazards.

FIG. 2 shows a schematic view of an after-cure geometry of the adhesive. Again, the heatspreader assembly includes a generally planar substrate 200 having a top surface 200a, a die 201 having a generally planar top surface 201 a and a bottom surface 201b and a generally planar heatspreader 202 having a bottom surface 202b. There are a number of interconnects 203 attached to the bottom surface 201b of die 201. Die 201 is mounted to substrate 200 through the interconnects 203 and optionally underfilled using an underfill material 204.

In FIG. 2, the heatspreader 202 is attached to the upper surface 201a of the die 201 using a specific adhesive distribution geometry 205. The adhesive distribution 205 completely surrounds the die 201 and completely encloses the underfill and die attachment fillet 204. Moreover, the cured adhesive 205 extends a preselected distance d beyond the edge of the underfill fillet 204. In the preferred embodiment this minimum distance is approximately 10 mils (for indicative purposes). As can be seen in FIG. 2, the adhesive 205 completely fills the space between the heatspreader bottom surface 202b and the substrate top surface 200a. In this manner, the heatspreader is directly anchored to both the die 201 and the substrate 200.

As seen in FIG. 2, the heatspreader 202 has a flat surface 202b adjacent the die upper surface 201a. The bondline thickness of the adhesive distribution 205,in this configuration is determined solely by the force that is applied to press the heatspreader down along the Z axis and maintain the heatspreader position during cure of the adhesive. In particular, dimensional tolerances such as die thickness will not affect the adhesive
bondline thickness. As described above, force is applied by a fixture (for example, a weight or a spring) that holds down the heatspreader and substrate onto a package carrier during the cure cycle. Upon completion of the cure cycle, the fixture may be removed.

The configuration of FIG. 2 improves the lid-pull strength of the assembly due to the increased area of attachment.

Additionally, the underfill material 204 and die to substrate attachment structure are completely enclosed by the heatspreader adhesive which protects the die 201 and underfill 204 from environmental conditions (for example, moisture and corrosion). Typically, the adhesive 205 is more impervious to moisture ingress than the underfill material, thus improving the reliability of the assembly. Similarly, the interconnects 203 also have and additional layer of protection from environmental conditions, again improving the reliability of the package.

FIG. 3A shows a pedestal mounted heatspreader configuration. As with the above-described embodiments, die 301 and its interconnects 303 are secured to substrate 300 by an underfill material 304. Adhesive is used to secure a heatspreader 302 to the die 301 as previously discussed. In FIG. 3A, the adhesive distribution 305 is similar to that shown and discussed in connection with FIG. 2. In this embodiment, however, a seal ring or pedestal 306 is used to provide additional anchoring of the heatspreader 302 to the substrate 300. The pedestal 306 extends generally around the periphery of the heatspreader 302. Additional adhesive is distributed on the substrate to function as pedestal-substrate bond 306a.

In this manner, the die 301 is enclosed within an additional protective barrier, namely the pedestal 306. The adhesive bondline thickness is maintained in a manner similar to that described above. However, additional compensation may have to be made for Z-axis dimensional tolerances. Dimensional tolerances for die thickness, pedestal height, die stand-off height and heatspreader flatness make it possible that the pedestal will contact the substrate surface in some situations. Such occurrences can result in thick and/or uncontrolled adhesive bondlines on the die since the bondline is no longer controlled solely by the force applied during the adhesive cure, but rather can be affected by dimensional tolerances of the pedestal 306 and die 301.

The potential for such irregularities in the bondline and the assembly in general can be overcome. As seen in FIG. 3B, the height of pedestal 306 can be reduced so that it can never contact the substrate, even for a worst case tolerance situation. To compensate for the shorter pedestal height, a higher mound of adhesive is applied to function as the pedestal-substrate bond 306a. A higher viscosity adhesive than might otherwise be used might have to be applied in this situation. By using this "floating" pedestal configuration, the adhesive bondline between the die 301 and the heatspreader 302 again is controlled solely by the Z-axis force applied prior to and during the adhesive cure.

Depending, for example, on the adhesive chosen, compensation may also have to be made for adhesive outgassing during the adhesive cure cycle. In the pedestal configurations shown in FIG. 3A and FIG. 3B, the pedestal 306 might trap gases that are released during the adhesive cure cycle (or at other times, for example during air/gas expansion at high temperatures). Pressure created by outgassing or other causes can cause the heatspreader to tilt, thereby creating an uneven bondline between the die 301 and the heatspreader 302. This potential problem can be avoided in several ways.

First, as illustrated in FIGS. 3C and 3D, adhesive can be dispensed only at the corners or other preselected intermittent locations around the periphery of the heatspreader 302. Any interruption in the adhesive distribution will create holes 306c that can function as vents during the cure cycle or at other times, permitting gaseous communication between all of the applications of the adhesive (including inside the pedestal 306) and the ambient environment. Alternatively or in addition, apertures or slots 306b in pedestal 306 can also provide venting between applications of the adhesive and the ambient environment. This slotted pedestal configuration is shown in FIGS. 3E and 3F. These two embodiments of the heatspreader assembly permit otherwise entrapped gases to escape. The intermittent adhesive dispensing and/or slots illustrated in FIGS. 3C–3F are equally applicable to both normal pedestal and floating pedestal embodiments.

An alternative two part heatspreader assembly is illustrated in FIG. 4. As with the above-described embodiments, die 401 and its interconnects 403 are secured to substrate 400 by an underfill material 404. Adhesive is used to secure a heatspreader 402 to the die 401 as previously discussed. The adhesive distribution 405 is similar to that shown and discussed in connection with FIG. 2. In FIG. 4, however, a two part heatspreader support 406 is used to provide additional support and lateral stability for the heatspreader 402 which again is attached directly to the substrate 400. Like the pedestal configuration, the two part heatspreader support 406 extends generally around the periphery of the heatspreader 402. The first support member 406a is similar to the pedestal discussed and described above. In this embodiment, second member 406b is a channel secured to the bottom surface 402b of the heatspreader plate 402. Members 406a and 406b mate to prevent lateral (X-Y axes) displacement of the heatspreader 402. Techniques similar to the pedestal configuration can be used to maintain consistent bondline thickness and to handle outgassing (for example, through intermittent use of adhesive in connection with a "floating" member 406a or through the use of slots or apertures in the heatspreader support 406). It should be appreciated that the adhesive used to secure the support members 406a and 406b may be different than the adhesive 405 used to secure the heat spreader to the die.

Figure 5:
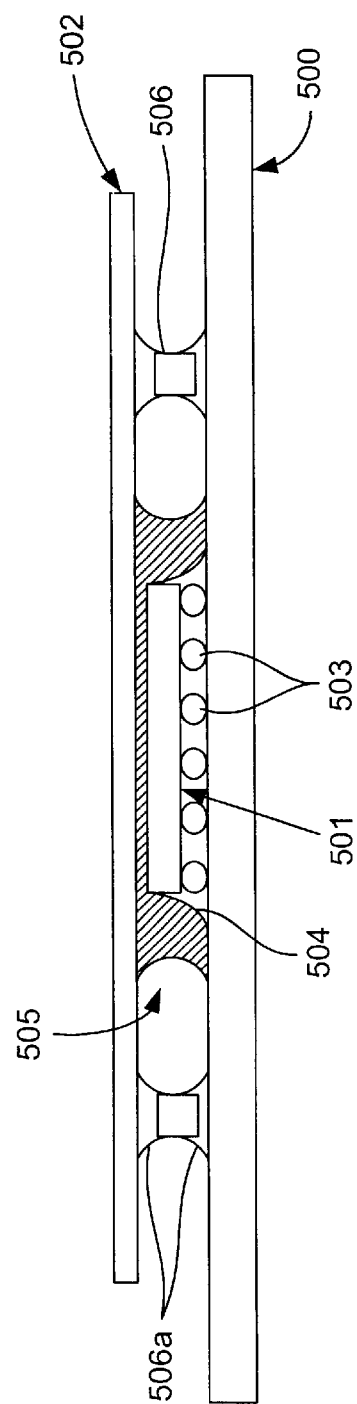
FIG. 5 is a side view of a passive component attachment of a flat heatspreader to a die secured to a substrate using underfill material and adhesive.

In FIG. 5, one or more passive components 506 are used to assist in supporting heatspreader 502. As with the above-described embodiments, die 501 and its interconnects 503 are secured to substrate 500 by an underfill material 504. Adhesive is used to secure a heatspreader 502 to the die 501 as previously discussed. The adhesive distribution 505 is similar to that shown and discussed in connection with FIG. 2. In FIG. 5, passive component 506 is secured to both the heatspreader 502 and the substrate 500 using adhesive 506a. As discussed in connection with other configurations, varying amounts and distributions of adhesive may be used in connection with the passive component 406 in order to maintain consistent bondline thickness and to accommodate outgassing. The passive component can be a resistor or any other component otherwise found on substrate 500. Again, it should be appreciated that the materials 506a used to secure the passive component 506 may be different than the adhesive 505 used to secure the heat spreader to the die. Additionally, it should be appreciated that the passive component may be (and typically would be) first attached to either the substrate 500 or the heat spreader 502 and then later attached to the other piece. For example, the passive component is typically attached to the substrate by solder alloys while the attachment on top of the passive component is made by adhesive. Thus, while the drawing show only adhesive 506a, it should be appreciated that the term "adhesive" in this context is intended to broadly cover any material or materials capable of adhering the passive component as described. Further, it is contemplated that the "adhesive" labeled 506a may be formed from multiple different materials.

Figure 6:
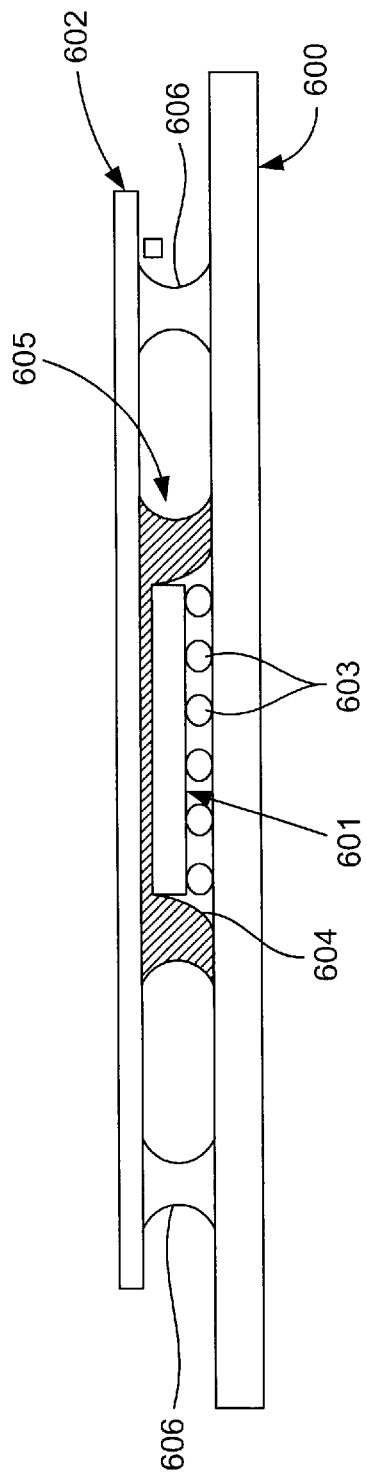
FIG. 6 is a side view of an attachment of a flat heatspreader to a die secured to a substrate using underfill material and adhesive in which adhesive is applied at a plurality of locations.

FIG. 6 shows die 601 and its interconnects 603 secured to substrate 600 by an underfill material 604. Adhesive is used to secure a heatspreader 602 to the die 601 as previously discussed. A first adhesive distribution 605 is similar to that shown and discussed in connection with FIG. 2. In FIG. 6, the pedestal type of structure has been replaced with one or more additional adhesive distributions 606. Typically, an adhesive used in this manner will need to have a relatively high viscosity so that it does not spread out or disconnect from the heatspreader before or during the curing cycle. Again, adhesive 606 can be of a different formulation from adhesive 605. This configuration is especially advantageous as the size of a die decreases. Miniaturization of devices and the use of a flat heatspreader configuration lead to smaller surface areas for adhesive connection of the heatspreader. By using an adhesive distribution such as the one shown in FIG. 6, greater surface adhesion is realized, thereby improving stud pull strengths and reliability of the package at a lower cost.

Figure 7:
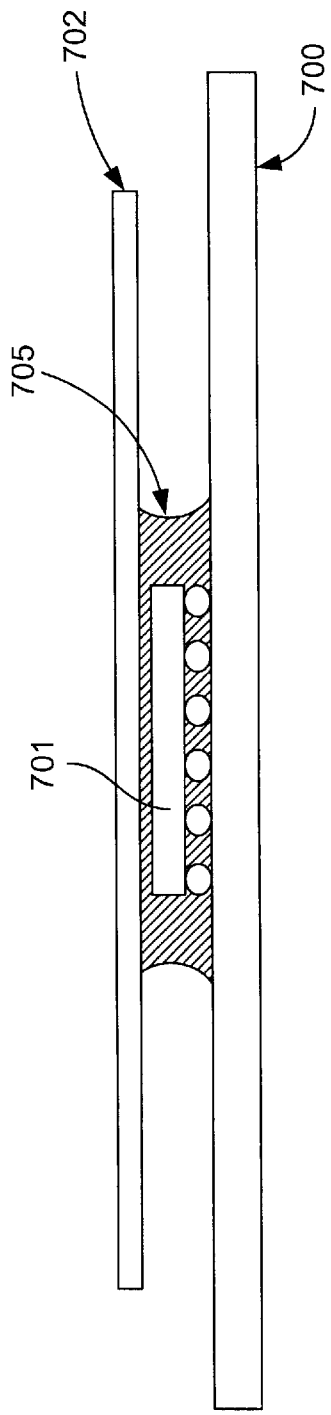
FIG. 7 is a side view of an attachment of a flat heatspreader to a die secured to a substrate using a single material to function as underfill material and adhesive.

FIG. 7 shows die 701 and its interconnects secured to substrate 700 by an underfill material. Adhesive is used to secure a heatspreader 702 to the die as previously discussed. FIG. 7 further discloses an embodiment in which the underfill material and adhesive are the same material 705. Since only one curable material is used, only one curing cycle is needed. Moreover, consistent bondline thickness is improved since it is unaffected by excess underfill material that may have migrated to the top of the die and have been cured prior to the heatspreader attachment step.

Other Improvements

Generally, any of the embodiments disclosed and claimed herein can be improved by improving the heatspreader's adhesion to the die and/or the substrate. Adhesion of the heatspreader can be improved through chemical and mechanical treatment of one or more of the various interfaces. In this case, "interfaces" include any surface where adhesive and/or underfill material might be applied.

In the typical manufacturing process, the underfill material is cured first before the package moves on to have the heatspreader attached. However, where the adhesive and the underfill material are in contact, curing the underfill material and adhesive simultaneously can yield some additional benefits. First, since the underfill material is uncured, it may be possible to crosslink the underfill material and the heatspreader adhesive during curing, thereby improving adhesion of the adhesive to the underfill fillet 104. Moreover, simultaneous curing of the underfill and adhesive reduces the risk of irregularities in the bondline that might otherwise result from excess underfill material that might have migrated to the upper surface of the die and have been cured prior to the adhesive cure cycle. Finally, process cycle times are improved with the elimination of one cure cycle.

Additionally, one or more surfaces can be roughened by sandblasting or other "macroscopic" techniques that will roughen a surface. Many of these techniques will be known by one presently of ordinary skill in the art and will not be discussed in detail herein. Another way of improving the die surfaces' adhesion properties is to use a wafer backgrind to roughen a die surface.

Another alternative is to anodize a heatspreader surface. By controlling the porosity and thickness of the anodization, adhesion can be enhanced. Again, such techniques are well known to those of ordinary skill in the art and will not be discussed in detail. During wafer fabrication, the oxide thickness on the wafer surface can be controlled to improve adhesion. Finally, a primer material of some sort can be used on a surface to enhance adhesion.

Figure 8A:
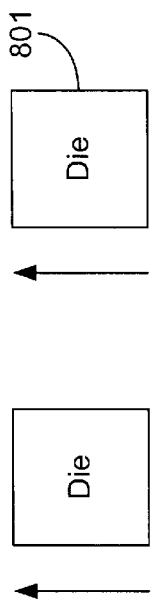
FIG. 8A is a schematic view of a typical assembly line for applying a single gradual underfill fillet to a flat heatspreader and die assembly.
Figure 8B:
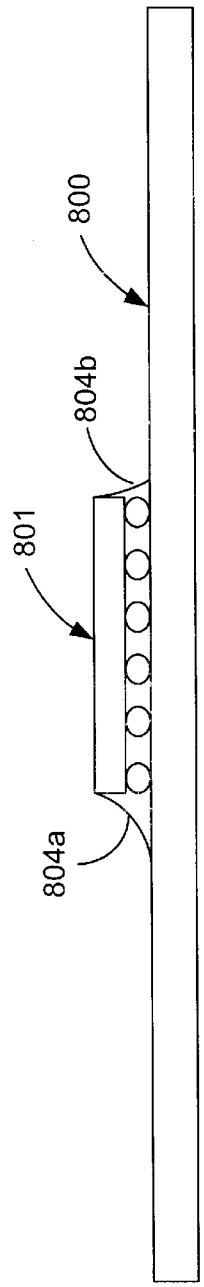
FIG. 8B is a side view of an underfill attachment of a die to a substrate using the assembly line of FIG. 8A.
Figure 8C:
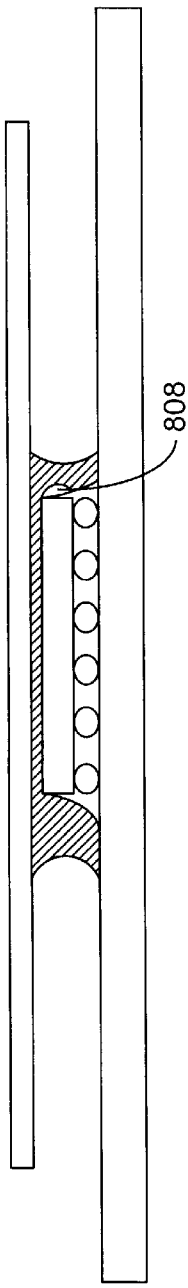
FIG. 8C is a side view of the attachment of a flat heatspreader to a die secured to a substrate using the assembly line of FIG. 8A.

Typical underfill application processes consist of a dispensing line such as that shown in FIG. 8A. As a result, a gradual closing fillet 804a is applied on only one side of the die 801, as seen in FIG. 8B. The other three sides of the die 801 lack the more gradual and extended underfill fillet, resulting in a steeper and more abrupt line 804b between the die 801 and the substrate 800. When adhesive is applied in a manner similar to the distribution shown in FIG. 2, gaps 808 can form at the steeper edges 804b of the die 801. Such gaps 808 can lead to uneven stresses which may make delamination more likely and also may lead to outgassing problems during curing of the underfill and/or the adhesive.

Figure 9A:
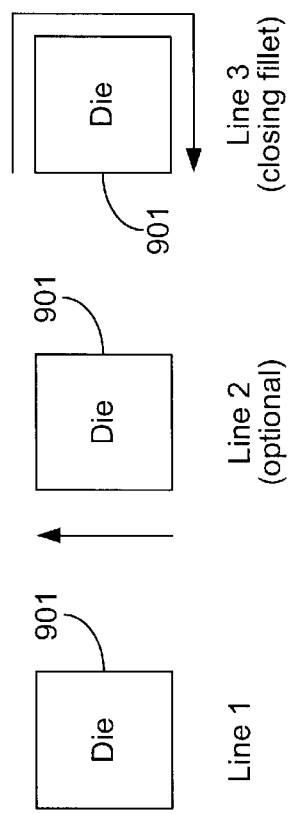
FIG. 9A is a schematic view of an assembly line of the present invention for applying gradual underfill fillets to all sides of a flat heatspreader and die assembly.
Figure 9B:
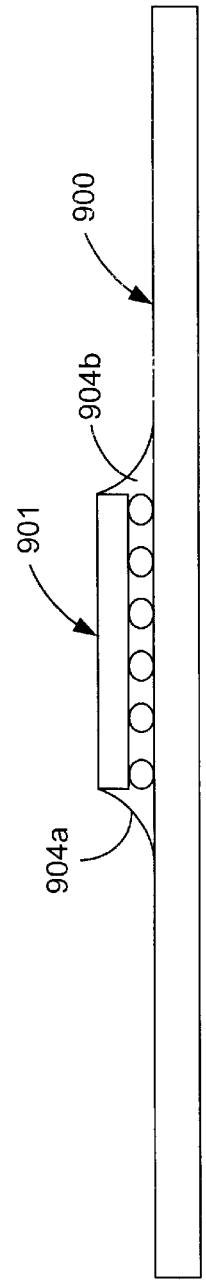
FIG. 9B is a side view of an underfill attachment of a die to a substrate using the assembly line of FIG. 9A.
Figure 9C:
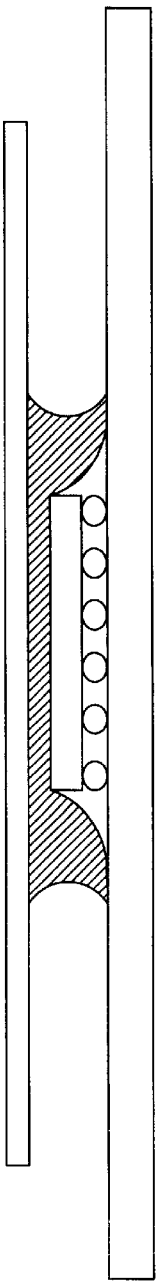
FIG. 9C is a side view of the attachment of a flat heatspreader to a die secured to a substrate using the assembly line of FIG. 9A.

An alternative dispensing line, as illustrated in FIG. 9A, can apply an even, gradual fillet 904a around all four sides of the die 901. If a gradual fillet 904a is applied, as shown in FIG. 9B, then a high viscosity adhesive material can flow down evenly and without gaps, as seen in FIG. 9C.

Adhesive and Heatspreader Materials

As noted above, low CTE heatspreaders (for example, SiC, Invar, AlN and Cu—Mo) are commonly attached directly to a die using commercially available adhesives. The CTE mismatch between these conventional heatspreaders and a die made of a material such as silicon is small and has very little, if any, effect on the performance of the device since the thermomechanical stresses generated are relatively small. Contrary to common practice, the heatspreader proposed in the present invention's embodiments possesses a high CTE (above 10 ppm/C). It can be made of a material such as aluminum (CTE of 23 ppm/C) or copper (CTE of 17 ppm/C). However, the die typically still possesses a low CTE (below 10 ppm/C and often about 2.6 ppm/C) common to devices of this type.

Through the use of an adhesive possessing characteristics uncommon to this type of application (and discussed in more detail below), the present invention can be further enhanced by using an adhesive that improves the connection between a high CTE heatspreader and a standard low CTE die. Because the bond between the heatspreader and the die is able to withstand a substantial amount of thermal variation and still function adequately with this type of adhesive, the heatspreader does not have to be fabricated in a specialized shape or configuration.

The adhesive is chosen so that it has the right combination of mechanical and thermal properties and is commercially available. The objective is to maximize thermal performance without compromising reliability. Some of the effects of the adhesive's properties on reliability and thermal conductivity are generally given below:

| Property of heatspreader adhesive | Reliability | Thermal conductivity |
| --- | --- | --- |
| Modulus E | Lower the better | |
| CTE | Lower the better | |
| Filler density | | Higher the better |
| Moisture absorption | Lower the better | |
| Adhesive strength | Higher the better | |
| Cohesive strength | Higher the better | |
| Bondline thickness | Higher the better | Lower the better |

A thicker bondline lowers the shear stress on the adhesive bond, thus improving reliability. However, a thicker bondline may also lower thermal resistance, thus lowering overall thermal performance. Therefore, an optimal bondline thickness should be chosen after balancing the various effects on reliability and thermal performance. In the present invention, a bondline of less than 25 microns was found to be best.

More specifically, to accommodate the substantial difference in thermal expansion between the die and the heatspreader in the present invention, an adhesive having the following characteristics is used where a silicon die is present:

modulus E<10 Mpa filler particle size <5 microns thermal conductivity K~<1.0 W/mk CTE between 100 and 250 ppm/C (for temperatures −55 to 125 C)

moisture absorption<0.1 % by weight glass transition temperature<−40 C

Use of an adhesive possessing these characteristics produces an IC package that can meet the following thermal and reliability requirements:

Thermal performance:

$R_{jc}$<1.5 C/W for a die size of 60 mm² or smaller

Reliability: Pass the following reliability test (MEL-STD 883) with no functional (electrical or thermal) degradation and no delamination of the adhesive interfaces
ACLV 168 hrs.
TMCL (−55 to 125) 1000 cycles
TMSK (−55 to 125) 1000 cycles
MS/MV (shock 1500 g peak level for 0.5 ms; frequency sweep)

Stud Pull: Stud pull (heatsink pull) force has to be maintained at 35 kgf or above before and after the reliability tests The following presently available commercial adhesives meet the above-listed criteria and successfully pass the $R_{jc}$, reliability and studpull requirements and can be used in the present invention where a silicon die is in use: Dow Corning Sylgard Q3-6605, Dow Corning Sylgard 577, Loctite FMD588 and Wacker semicosil 980.

The described arrangement allows the semiconductor package to meet or exceed the following requirements. The package will have a junction to case thermal resistance of 1.5 degrees Celsius per watt or lower. The package can electrically pass the following environmental stress requirements as set out in Military Standard 883

Autoclave test for 168 hrs

Temperature cycle (Condition B) test for 1000 cycles

Thermal shock (Condition B) for 1000 cycles

Mechanical shock and vibration test

No delamination will be present at the heatspreader to die interfaces at the conclusion of the Military standard tests.

SUMMARY

Although only one embodiment of the present invention has been described in detail, it should be understood that the present invention may be embodied in many other specific forms without departing from the spirit or scope of the invention. For instance, only one or fewer than all of the improvements disclosed herein (use of specific heatspreader geometries, adhesive geometries, assembly techniques, underfill geometries, and specific adhesive materials to attach the heatspreader to the die) may be used while still realizing significant improvements in the performance of the IC package.

Such variations, modifications and other applications of the present invention will become apparent to those presently of ordinary skill in the art after reviewing the specification in connection with the FIGURES. Therefore, any preceding examples are to be considered as illustrative and not restrictive, and the invention is not to be limited to the details given herein, but may be modified within the scope of the appended claims. Further, the above description of the preferred embodiment is to be interpreted as illustrative rather than limiting. The scope of the present invention is limited, if at all, solely by the scope of the claims which follow.

What is claimed is:

1. A die packaging assembly comprising:
   a substrate including a top surface;
   a die including a top surface and a bottom surface, the bottom surface of the die being connected to the substrate;
   a heatspreader including a bottom surface; and
   an adhesive that integrally attaches the heatspreader bottom surface to the top surfaces of both the die and the substrate.

2. The die packaging assembly of claim 1 wherein:
   there is a space between the bottom surface of the die and the top surface of the substrate, the space being filled with an underfill material; and
   the adhesive completely surrounds and encloses the die and the underfill material.

3. The die packaging assembly of claim 1 wherein said heatspreader includes a first member and a second member; further wherein said heatspreader first member is attached to said die top surface and said heatspreader second member is attached to said substrate top surface; further wherein said heatspreader first member mates with said heatspreader second member, thereby maintaining the positions of said heatspreader first and second members relative to one another.

4. The die packaging assembly of claim 1 wherein said heatspreader bottom surface is attached to said substrate top surface by said adhesive at a plurality of sites.

5. The die packaging assembly of claim 1 wherein the adhesion of said adhesive is enhanced by treating at least one of said surfaces contacting said adhesive.

6. The die packaging assembly of claim 1 wherein said underfill material forms a closing fillet surrounding said die.

7. A die packaging assembly comprising:
   a substrate including a top surface;
   a die including a top surface and a bottom surface, the bottom surface of the die being connected to the substrate;
   a heatspreader including a bottom surface, the heatspreader bottom surface being attached to the die top surface and to the substrate top surface by an adhesive;
   wherein the bondline of the adhesive between the die and the heatspreader is less than 25 microns.

8. A die packaging assembly comprising:
   a substrate including a top surface;
   a die including a top surface and a bottom surface, the bottom surface of the die being connected to the substrate;
   a heatspreader including a bottom surface, the heatspreader bottom surface being attached to the die top surface and to the substrate top surface by an adhesive;
   wherein there is a space between the die bottom surface and the substrate top surface, the space being filled with an underfill material; and
   wherein the adhesive completely surrounds and encloses the die and the underfill material; and further wherein the adhesive has a minimum surrounding thickness of at least about 10 mils about the die.

9. A die packaging assembly comprising:
a substrate including a top surface;
a die including a top surface and a bottom surface, the bottom surface of the die being connected to the substrate;
a heatspreader including a bottom surface, the heatspreader bottom surface being attached to the die top surface and to the substrate top surface by an adhesive; and
a pedestal secured between the heatspreader and the substrate.

10. The die packaging assembly of claim 9 wherein said heatspreader has a periphery and said pedestal extends around said heatspreader periphery.

11. The die packaging assembly of claim 9 wherein said pedestal is a floating pedestal.

12. The die packaging assembly of claim 9 Wherein said pedestal and said substrate top surface are attached by applying said adhesive in a preselected adhesive application configuration which provides gaseous communication between all applications of said adhesive and the ambient environment.

13. The die packaging assembly of claim 12 wherein said adhesive application configuration comprises intermittent adhesive attachment of said pedestal to said substrate top surface.

14. The die packaging assembly of claim 12 wherein said pedestal has at least one aperture permitting gaseous communication between all applications of said adhesive and the ambient environment.

15. A die packaging assembly comprising:
a substrate including a top surface;
a die including a top surface and a bottom surface, the bottom surface of the die being connected to the substrate;
a heatspreader including a bottom surface, the heatspreader bottom surface being attached to the die top surface and to the substrate top surface by an adhesive;
wherein said heatspreader includes a first member and a second member; further wherein said heatspreader first member is attached to said die top surface and said heatspreader second member is attached to said substrate top surface; further wherein said heatspreader first member mates with said heatspreader second member, thereby maintaining the positions of said heatspreader first and second members relative to one another; and
further wherein said heatspreader first member has a periphery and a channel on said heatspreader first member, wherein said channel extends around said heatspreader first member periphery and mates with said second member.

16. The die packaging assembly of claim 15 wherein said heatspreader first and second members include at least one aperture permitting gaseous communication between all applications of said adhesive and the ambient environment.

17. A die packaging assembly comprising:
a substrate including a top surface;
a die including a top surface and a bottom surface, the bottom surface of the die being connected to the substrate;
a heatspreader including a bottom surface, the heatspreader bottom surface being attached to the die top surface and to the substrate top surface by an adhesive;
wherein said substrate includes a passive component connected to said substrate top surface and further wherein said heatspreader bottom surface is attached to said passive component with said adhesive.

18. The die packaging assembly of claim 17 wherein said passive component at least in part defines one aperture permitting gaseous communication between all applications of said adhesive and the ambient environment.

19. A die packaging assembly comprising:
a substrate including a top surface;
a die including a top surface and a bottom surface, the bottom surface of the die being connected to the substrate;
a heatspreader including a bottom surface, the heatspreader bottom surface being attached to the die top surface and to the substrate top surface by an adhesive;
wherein said heatspreader bottom surface is attached to said substrate top surface by said adhesive at a plurality of sites; and
further wherein said plurality of adhesive sites define at least one aperture permitting gaseous communication between all applications of said adhesive and the ambient environment.

20. The die packaging assembly of claim 19 wherein the adhesion of said adhesive is enhanced by treating at least one of said surfaces contacting said adhesive.

21. The die packaging assembly of claim 5 wherein said treatment is mechanical treatment.

22. The die packaging assembly of claim 5 wherein said treatment is chemical treatment.

23. The die packaging assembly of claim 21 wherein said mechanical treatment is sandblasting.

24. The die packaging assembly of claim 21 wherein said mechanical treatment is grinding.

25. The die packaging assembly of claim 22 wherein said chemical treatment comprises controlling the oxide thickness of said die top surface.

26. The die packaging assembly of claim 22 wherein said chemical treatment comprises anodizing said heatspreader bottom surface.

27. A die packaging assembly comprising:
a substrate including a top surface;
a die including a top surface and a bottom surface, the bottom surface of the die being connected to the substrate;
a heatspreader including a bottom surface, the heatspreader bottom surface being attached to the die top surface and to the substrate top surface by an adhesive;
wherein said underfill material and said adhesive are the same material.

28. A die packaging assembly comprising:
a substrate including a top surface;
a silicon die including a top surface and a bottom surface;
wherein said die bottom surface is attached to said substrate top surface;
further wherein the space between the said die bottom surface and said substrate top surface is optionally filled with an underfill material;
a heatspreader including a bottom surface;
wherein said heatspreader bottom surface is attached to said die top surface with an adhesive;

further wherein said adhesive has the following characteristics modulus E<10 Mpa
filler particle size <5 microns
thermal conductivity K~1.0 W/mk
CTE between 100 and 250 ppm/C (for temperatures −55 to 125 C)
moisture absorption <0.1 % by weight
glass transition temperature<−40 C; and
further wherein said heatspreader has a CTE>10 ppm/ C.

29. A die packaging assembly as recited in claim 28 wherein the package has a junction to case thermal resistance of not more than 1.5 degrees Celsius per watt and is designed to pass the environmental stress requirements as set out in Military Standard 883 without delamination at the heatspreader to die interface, the Military Standard 883 tests including an autoclave test for 168 hrs, a temperature cycle (Condition B) test for 1000 cycles, a thermal shock (Condition B) test for 1000 cycles, and a mechanical shock and vibration test.

* * * * *